(12) United States Patent
Liu et al.

(10) Patent No.: US 10,366,941 B2
(45) Date of Patent: Jul. 30, 2019

(54) PACKAGE STRUCTURE

(71) Applicant: Winbond Electronics Corp., Taichung (TW)

(72) Inventors: Chen-Heng Liu, Taichung (TW); Yung-Fu Chang, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 15/853,979

(22) Filed: Dec. 26, 2017

(65) Prior Publication Data

US 2018/0240736 A1     Aug. 23, 2018

(30) Foreign Application Priority Data

Feb. 21, 2017    (CN) .......................... 2017 1 0092831

(51) Int. Cl.
    *H01L 23/482*     (2006.01)
    *H01L 23/00*     (2006.01)
    (Continued)

(52) U.S. Cl.
    CPC .... *H01L 23/4824* (2013.01); *H01L 21/02118* (2013.01); *H01L 22/32* (2013.01);
    (Continued)

(58) Field of Classification Search
    CPC ......... H01L 24/13; H01L 24/14; H01L 24/06; H01L 24/05; H01L 23/4981; H01L 21/02118; H01L 23/4824
    See application file for complete search history.

(56) References Cited

U.S. PATENT DOCUMENTS 8,558,229 B2    10/2013   Jeng et al.
2003/0109079 A1*   6/2003   Yamaguchi ......... H01L 23/3114
                                                                438/107
(Continued)

FOREIGN PATENT DOCUMENTS

TW            473896           1/2002
TW         200629438          8/2006
(Continued)

OTHER PUBLICATIONS

Topper et al, "A Comparison of Thin Film Polymers for Wafer Level Packaging", IEEE, 2010 Electronic Components and Technology Conference, pp. 769-776.*

(Continued)

*Primary Examiner* — Feifei Yeung Lopez
(74) *Attorney, Agent, or Firm* — JCIPRNET

(57) ABSTRACT

Provided is a package structure including a substrate, a metal pad, a first polymer layer, a second polymer layer, a redistribution layer (RDL), and a third polymer layer. The metal pad is located on the substrate. The first polymer layer is located on the substrate. The first polymer layer has a first opening which exposes a portion of a top surface of the metal pad. The second polymer layer is located on the first polymer layer. The second polymer layer has a second opening which exposes the portion of the top surface of the metal pad and a first top surface of the first polymer layer. The RDL covers the portion of the top surface of the metal pad and extends onto a portion of the first top surface of the first polymer layer and the second polymer layer. The third polymer layer is located on the RDL.

19 Claims, 5 Drawing Sheets

(51) Int. Cl.
  *H01L 21/02* (2006.01)
  *H01L 23/498* (2006.01)
  *H01L 21/66* (2006.01)
  *H01L 23/525* (2006.01)
  *H01L 23/31* (2006.01)

(52) U.S. Cl.
  CPC .... H01L 23/49811 (2013.01); H01L 23/5256 (2013.01); H01L 24/02 (2013.01); H01L 24/06 (2013.01); H01L 24/13 (2013.01); H01L 24/14 (2013.01); *H01L 23/3114* (2013.01); *H01L 23/3192* (2013.01); *H01L 24/05* (2013.01); *H01L 2224/0235* (2013.01); *H01L 2224/0236* (2013.01); *H01L 2224/02373* (2013.01); *H01L 2224/02375* (2013.01); *H01L 2224/02379* (2013.01); *H01L 2224/0401* (2013.01); *H01L 2224/04042* (2013.01); *H01L 2224/05548* (2013.01); *H01L 2224/05554* (2013.01); *H01L 2224/05573* (2013.01); *H01L 2224/05624* (2013.01); *H01L 2224/05639* (2013.01); *H01L 2224/05644* (2013.01); *H01L 2224/05647* (2013.01); *H01L 2224/05655* (2013.01); *H01L 2224/05664* (2013.01)

(56) References Cited

U.S. PATENT DOCUMENTS

| | | | | |
|---|---|---|---|---|
| 2011/0193232 | A1* | 8/2011 | Chen | H01L 23/3192 257/762 |
| 2011/0254159 | A1* | 10/2011 | Hwang | H01L 24/05 257/738 |
| 2014/0264930 | A1* | 9/2014 | Yu | H01L 24/19 257/774 |
| 2018/0005930 | A1* | 1/2018 | Chiu | H01L 21/4846 |

FOREIGN PATENT DOCUMENTS

| | | |
|---|---|---|
| TW | 201030915 | 8/2010 |
| TW | I351082 | 10/2011 |
| TW | 201515177 | 4/2015 |
| TW | I493675 | 7/2015 |

OTHER PUBLICATIONS

"Office Action of Taiwan Counterpart Application," dated Feb. 23, 2018, p. 1-p. 8, in which the listed reference was cited.

* cited by examiner

PACKAGE STRUCTURE

CROSS-REFERENCE TO RELATED APPLICATION

This application claims the priority benefit of China application serial no. 201710092831.X, filed on Feb. 21, 2017. The entirety of the above-mentioned patent application is hereby incorporated by reference herein and made a part of this specification.

BACKGROUND

Technical Field

The disclosure relates to a semiconductor structure, and more particularly to a package structure.

Description of Related Art

In recent years, the semiconductor industry has experienced a rapid growth thanks to continuous improvements in integration density of various electronic components (e.g., transistors, diodes, resistors, capacitors, etc.). For the most part, such improvement in the integration density has come from successive reductions in minimum feature size, which allows more components to be integrated into a specific area.

These smaller electronic components occupy less area and thus require package structures that are smaller than conventional package structures. For example, when a semiconductor chip or die includes more and more input/output (I/O) pads, positions of the original I/O pads of the semiconductor chip or die are able to rearranged around the semiconductor chip or die by a redistribution layer (RDL). Then, an RDL pad is electrically connected to a leadframe or a circuit board by wire bonding or flip chip bonding.

Generally, after an RDL process is performed, an original I/O pad is exposed to a polyimide layer, thereby facilitating a chip probing (CP) test. The I/O pad is hereinafter referred to as a test pad. However, after undergoing the RDL process, an opening of the test pad shrinks, which affects a yield of the CP test subsequent to the RDL process.

SUMMARY

The disclosure provides a package structure which increases a width of a flat portion of a test pad so as to improve a yield of a CP test.

The disclosure provides a package structure which includes a substrate, a metal pad, a first polymer layer, a second polymer layer, and a redistribution layer (RDL). The metal pad is located on the substrate. The first polymer layer is located on the substrate. The first polymer layer has a first opening. The first opening exposes a portion of a top surface of the metal pad. The second polymer layer is located on the first polymer layer. The second polymer layer has a second opening. The second opening exposes the portion of the top surface of the metal pad and a first top surface of the first polymer layer. The RDL covers the portion of the top surface of the metal pad and extends onto a portion of the first top surface of the first polymer layer and the second polymer layer.

In an embodiment of the disclosure, the package structure further includes a passivation layer located between the substrate and the first polymer layer.

In an embodiment of the disclosure, the package structure further includes a third polymer layer located on the RDL. The third polymer layer has a third opening. The third opening exposes a portion of a top surface of the RDL.

In an embodiment of the disclosure, the second opening is larger than the first opening.

In an embodiment of the disclosure, the RDL directly contacts the portion of the first top surface of the first polymer layer.

In an embodiment of the disclosure, the RDL includes a test pad corresponding to the metal pad. The test pad includes a flat portion and an extension portion. The flat portion is located on a bottom surface of the first opening. The extension portion extends from one side of the flat portion onto a sidewall of the first opening and the portion of the first top surface of the first polymer layer.

In an embodiment of the disclosure, an angle between a bottom surface and a sidewall of the extension portion is 10 degrees to 90 degrees.

In an embodiment of the disclosure, a width of the flat portion is 15 μm to 70 μm.

In an embodiment of the disclosure, a number of the extension portion is two, and the two extension portions respectively extend from both sides of the flat portion onto the both sidewalls of the first opening and the portion of the first top surface of the first polymer layer.

In an embodiment of the disclosure, the substrate has a first region and a second region. The metal pad is located on the substrate in the first region. The first polymer layer, the second polymer layer and the RDL are sequentially located on the substrate in the first region and the second region. The RDL extends from the portion of the top surface of the metal pad onto the portion of the first top surface of the first polymer layer and the second polymer layer in the second region.

In an embodiment of the disclosure, the package structure further includes a third polymer layer located on the RDL. The third polymer layer has a third opening and a fourth opening. The third opening exposes a portion of a top surface of the RDL in the first region. The fourth opening exposes a portion of the top surface of the RDL in the second region.

In an embodiment of the disclosure, the third opening corresponds to the metal pad so as to perform a CP test.

In an embodiment of the disclosure, the package structure further includes a fuse structure located in the substrate between the first region and the second region.

Based on the above, in the disclosure, by reducing a thickness of a polymer layer below the extension portion of the test pad, the width of the flat portion of the test pad is increased. The disclosure has a CP test region larger than a conventional CP test region, so that operation window in placing probe pins can be increased and a yield of the CP test can be improved.

To make the above features and advantages of the disclosure more comprehensible, embodiments accompanied with drawings are described in detail as follows.

DETAILED DESCRIPTION OF DISCLOSED EMBODIMENTS

Figure 1:
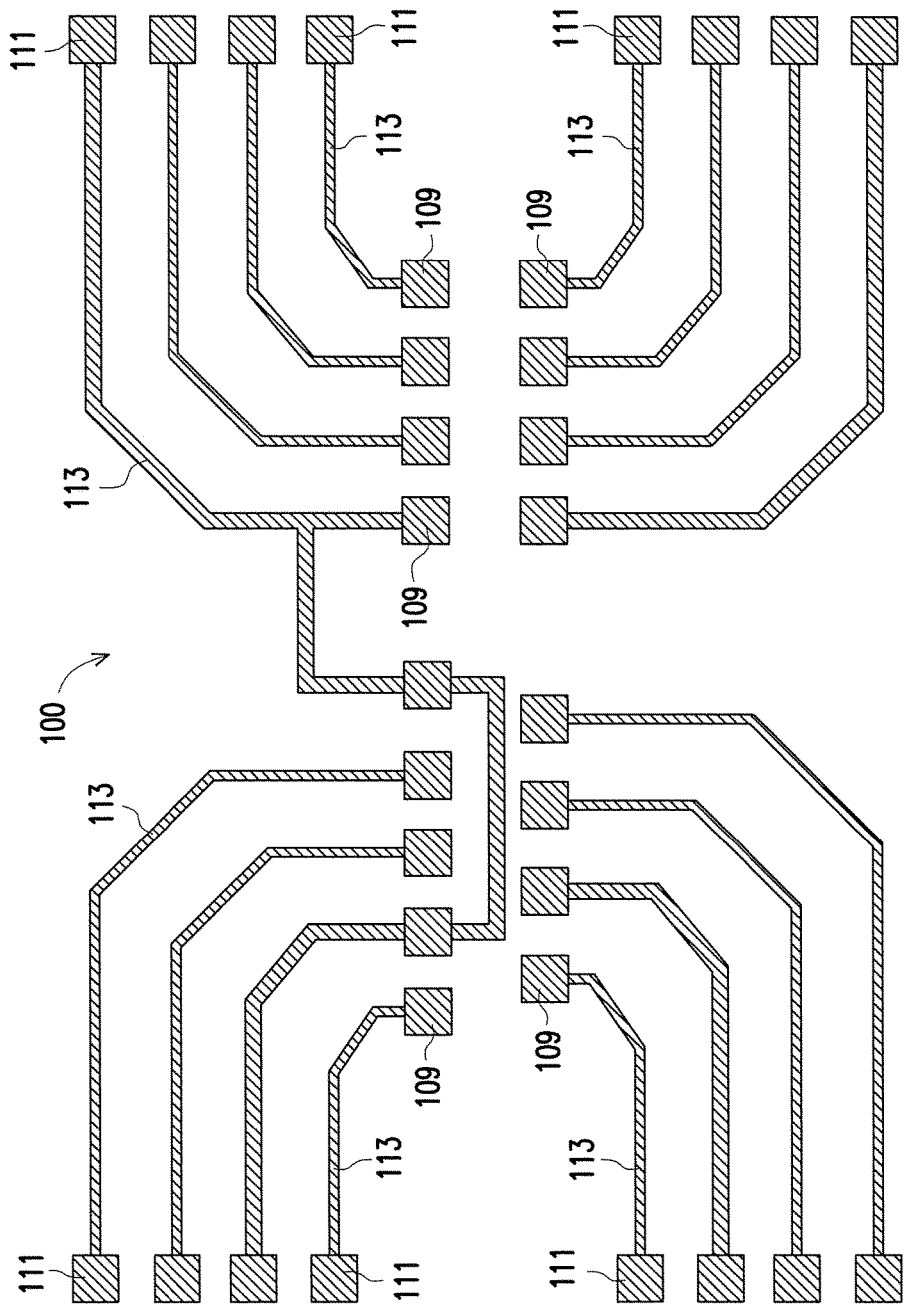
FIG. 1 is a top view of a package structure according to an embodiment of the disclosure.

The disclosure is illustrated more comprehensively referring to the drawings of the embodiments. However, the disclosure may be embodied in many different forms and should not be construed as limited to the embodiments set forth herein. Thicknesses of layers and regions in the drawings may be enlarged for clarity. The same or similar reference numerals represent the same or similar components, and are not repeated in the following paragraphs.

FIG. 1 is a top view of a package structure according to an embodiment of the disclosure. For clarity of the drawing, only a substrate, a test pad, a redistribution layer (RDL) pad and a trace are illustrated in FIG. 1.

Referring to FIG. 1, a test pad 109 is electrically connected to an RDL pad 111 through a trace 113. In an embodiment, it is clear from FIG. 1 that the test pad 109 is located in the center of a substrate 100 (or the whole package structure), and the RDL pad 111 is located on both sides of the substrate 100. However, the disclosure is not limited thereto. In other embodiments, the test pad 109 may be located on both sides or one side of the substrate 100. Any case where a distance is provided between a region (e.g., a first region R1 in FIG. 2B) having the test pad 109 therein and another region (e.g., a second region R2 in FIG. 2B) having the RDL pad 111 therein falls within the scope of the disclosure. In some embodiments, the test pad 109 (or the RDL pad 111) and the trace 113 may be located in the same layer. In alternative embodiments, the test pad 109 (or the RDL pad 111) and the trace 113 may be located in different layers.

Figure 2A:
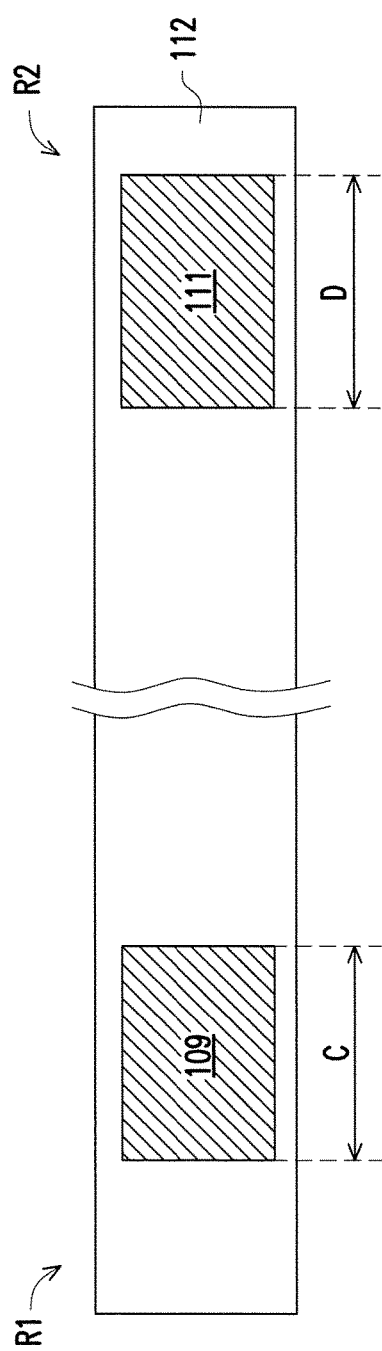
FIG. 2A is a plan view of a third polymer layer of a package structure according to a first embodiment of the disclosure.
Figure 2B:
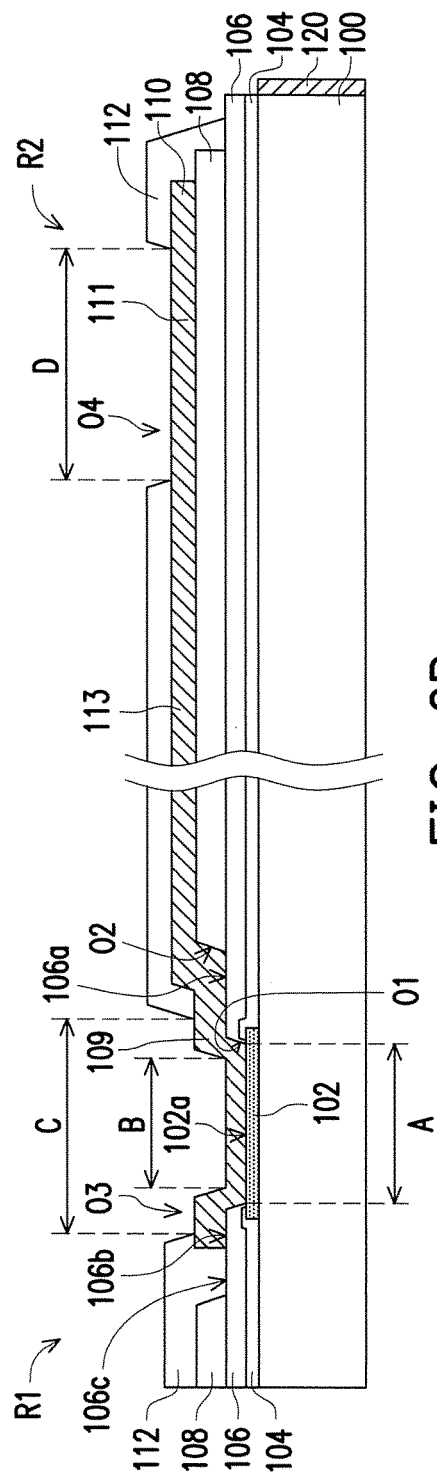
FIG. 2B is a schematic cross-sectional view of FIG. 2A.
Figure 2C:
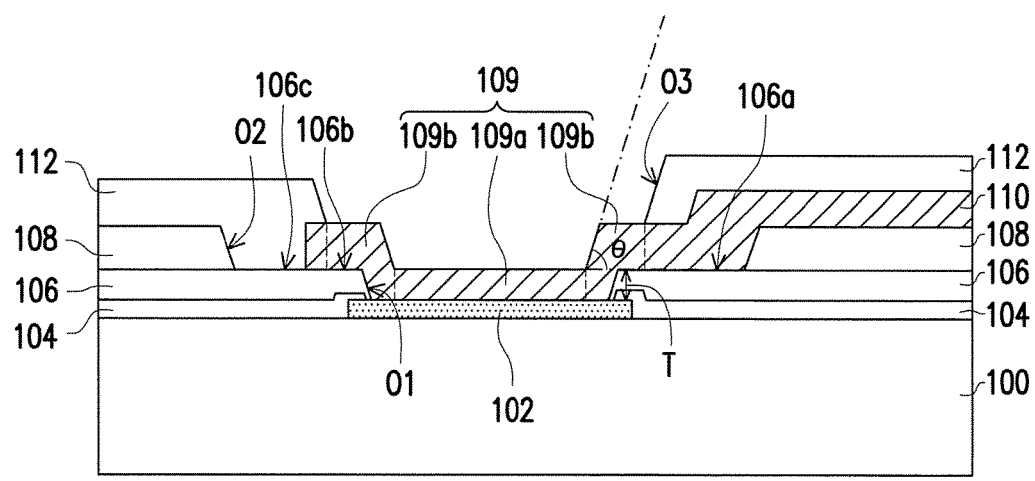
FIG. 2C is a partial enlarged view of the package structure in FIG. 2B.

FIG. 2A is a plan view of a third polymer layer of a package structure according to a first embodiment of the disclosure. FIG. 2B is a schematic cross-sectional view of FIG. 2A. FIG. 2C is a partial enlarged view of the package structure in FIG. 2B.

Referring to FIGS. 2A and 2B, the package structure of the first embodiment includes: the substrate 100, a metal pad 102, a passivation layer 104, a first polymer layer 106, a second polymer layer 108, a redistribution layer (RDL) 110, and a third polymer layer 112. In the present embodiment, the package structure may be a packaged semiconductor chip which is bonded to other substrates or chips through a bump or a wire.

In detail, the substrate 100 has the first region R1 and the second region R2. A distance is provided between the first region R1 and the second region R2, and the distance may be adjusted according to design needs. In an embodiment, the first region R1 has the test pad 109 therein, and the test pad 109 is configured to perform a chip probing (CP) test. In another embodiment, the second region R2 has the RDL pad 111 therein, and the RDL pad 111 is electrically connected to an external component (e.g., a leadframe or other circuit boards) by wire bonding or flip chip bonding. The test pad 109 in the first region R1 is electrically connected to the RDL pad 111 in the second region R2 through the trace 113. In an embodiment, the substrate 100 includes a semiconductor material, an insulator material, a conductor material or an arbitrary combination of the above materials. Moreover, the substrate 100 includes a single-layer structure or a multilayer structure. For example, the substrate 100 may be formed of at least one semiconductor material selected from a group consisting of Si, Ge, SiGe, GaP, GaAs, SiC, SiGeC, InAs and InP. In addition, a silicon-on-insulator (SOI) substrate may also be used. The substrate 100 may include a plurality of layers of materials, such as Si/SiGe and Si/SiC. However, the material of the substrate 100 is not limited thereto. In an embodiment, the substrate 100 has therein a semiconductor device such as a logic device, a memory device or a combination thereof.

The metal pad 102 is located on the substrate 100 in the first region R1. A material of the metal pad 102 includes a metal material. The metal material is, for example, copper, aluminum, gold, silver, nickel, palladium or a combination thereof. Although only one metal pad 102 is illustrated in FIGS. 2A and 2B, the disclosure is not limited thereto. In other embodiments, the number of the metal pad 102 may be adjusted according to needs. In an embodiment, the metal pad 102 is electrically connected to the semiconductor device (not illustrated) in the substrate 100.

The passivation layer 104 and the first polymer layer 106 are sequentially formed on the substrate 100 in the first region R1 and the second region R2, so that the passivation layer 104 is located between the substrate 100 and the first polymer layer 106. A material of the passivation layer 104 includes silicon nitride which has a thickness of 3 μm to 10 μm. A material of the first polymer layer 106 includes polyimide (PI), benzocyclobutene (BCB), polybenzooxazole (PBO) or any other suitable material. A thickness of the first polymer layer 106 is 3 μm to 10 μm. In an embodiment, the first polymer layer 106 protects a surface of the substrate 100 or the passivation layer 104 and reduces stress of the substrate 100 or the passivation layer 104.

The first polymer layer 106 has a first opening O1. The first opening O1 exposes a partial top surface 102a of the metal pad 102. In an embodiment, a width A of the exposed partial top surface 102a of the metal pad 102 is 30 μm to 100 μm.

The second polymer layer 108 is located on the first polymer layer 106. The second polymer layer 108 has a second opening O2. The second opening O2 exposes the partial top surface 102a of the metal pad 102 and top surfaces 106a, 106b and 106c of the first polymer layer 106. In an embodiment, the second opening O2 is larger than the first opening O1. As shown in FIG. 2B, the second opening O2 is located above the first opening O1, and the second opening O2 communicates with the first opening O1 to form an opening having a wide top and a narrow bottom. The opening having a wide top and a narrow bottom has a sidewall which is a stair-shaped sidewall. In an embodiment, a material of the second polymer layer 108 includes polyimide (PI), benzocyclobutene (BCB), polybenzooxazole (PBO) or any other suitable material. A thickness of the second polymer layer 108 is 3 μm to 10 μm. In an embodiment, the second polymer layer 108 electrically insulates a conductive layer (e.g., a fuse structure 114 in FIG. 4) therebelow from the RDL 110 that is subsequently formed, so as to avoid an electric short circuit. In alternative embodiments, the second polymer layer 108 may be used as a buffer layer for increasing adhesion between the first polymer layer 106 and the subsequently formed RDL 110.

The RDL 110 covers the partial top surface 102a of the metal pad 102 and extends onto the partial top surfaces 106a and 106b of the first polymer layer 106 and the second polymer layer 108. In other words, the RDL 110 is conformally formed on the stair-shaped sidewall, and extends into the second region R2. In an embodiment, the RDL 110 directly contacts the partial top surface 102a of the metal pad 102 and also directly contacts the partial top surfaces 106a and 106b of the first polymer layer 106, but does not contact another partial top surface 106c of the first polymer layer 106. As shown in FIG. 2B, a portion of the RDL 110 that corresponds to the metal pad 102 may be regarded as the test pad 109; a portion of the RDL 110 that is exposed to a subsequently formed fourth opening O4 may be regarded as the RDL pad 111; and a portion of the RDL 110 between the test pad 109 and the RDL pad 111 may be regarded as the trace 113. The trace 113 extends from the first region R1 into the second region R2, so as to electrically connect the test pad 109 in the first region R1 to the RDL pad 111 in the second region R2. Therefore, in the present embodiment, the test pad 109 in the first region R1 is redistributed to the RDL pad 111 in the second region R2 through the trace 113, and the RDL pad 111 is electrically connected to an external component (e.g., a leadframe or other circuit boards) by wire bonding or flip chip bonding. In an embodiment, the RDL 110 includes a metal material. The metal material is, for example, copper, aluminum, gold, silver, nickel, palladium or a combination thereof.

The third polymer layer 112 is located on the RDL 110 and covers sidewalls of the RDL 110 and the second polymer layer 108. The third polymer layer 112 has a third opening O3 and the fourth opening O4. The third opening O3 corresponds to the metal pad 102 and exposes a top surface of the test pad 109 in the first region R1. The fourth opening O4 exposes a top surface of the RDL pad 111 in the second region R2. In an embodiment, a material of the third polymer layer 112 includes polyimide (PI), benzocyclobutene (BCB), polybenzooxazole (PBO) or any other suitable material. A thickness of the third polymer layer 112 is 3 μm to 10 μm. In some embodiments, the first polymer layer 106, the second polymer layer 108 and the third polymer layer 112 may include different materials from one another. In alternative embodiments, the first polymer layer 106, the second polymer layer 108 and the third polymer layer 112 may include the same material. In an embodiment, a width C of the third opening O3 is 35 μm to 150 μm; a width D of the fourth opening O4 is 30 μm to 150 μm. In addition, the package structure of the first embodiment further includes a seal ring 120 disposed on a sidewall of the substrate 100.

Figure 4:
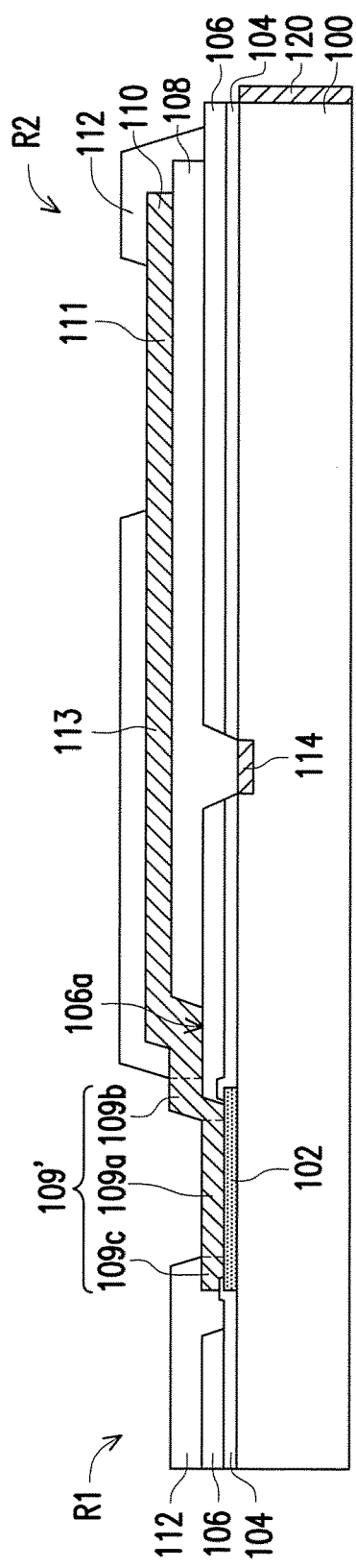
FIG. 4 is a schematic cross-sectional view of a package structure according to a third embodiment of the disclosure.

Referring to FIG. 2C, the test pad 109 (portion of the RDL 110) includes a flat portion 109a and two extension portions 109b. The flat portion 109a is located on a bottom surface of the first opening O1. One of the two extension portions 109b extends from one side of the flat portion 109a onto one sidewall of the first opening O1, the partial top surface 106a of the first polymer layer 106, and a sidewall and a top surface of the second polymer layer 108. On the other hand, the other of the two extension portions 109b extends from the other side of the flat portion 109a onto the other sidewall of the first opening O1 and the partial top surface 106b of the first polymer layer 106, but does not extend onto the partial top surface 106c of the first polymer layer 106. A gap is provided between the other of the two extension portions 109b and the second opening O2 (or the second polymer layer 108), so that the third polymer layer 112 fills the gap. That is, a portion of the third polymer layer 112 is located between the other of the two extension portions 109b and the second polymer layer 108. However, the disclosure is not limited thereto. In alternative embodiments, a test pad 109' (as shown in FIG. 4) may have the extension portion 109b on one side. The extension portion 109b on one side is connected to one side of the flat portion 109a and extends onto the second polymer layer 108 in the second region R2.

It is worth noting that, as shown in FIGS. 2B and 2C, in the present embodiment, the second polymer layer 108 below the extension portions 109b may be omitted, so that a total thickness T of the passivation layer 104 and the first polymer layer 106 below the extension portions 109b is 6 μm to 15 μm, and that an angle Θ between a bottom surface and a sidewall of the extension portions 109b is 10 degrees to 90 degrees. In addition, the extension portions 109b directly contact sidewalls and the partial top surfaces 106a and 106b of the first polymer layer 106, which increases contact area between the flat portion 109a and the metal pad 102. The contact area may be regarded as a CP test region. That is, when a CP test is performed in this region, the CP test will not fail due to defective contact. Therefore, the disclosure has a CP test region larger than conventional CP test regions, so that operation window in placing probe pins can be increased and a yield of the CP test can be improved. In an embodiment, a width B (i.e., the CP test region) of the flat portion 109a is 15 μm to 90 μm. In alternative embodiments, a ratio (i.e., B/A) between the width B of the flat portion 109a and the width A of the metal pad 102 is 15:30 to 90:100.

Figure 3A:
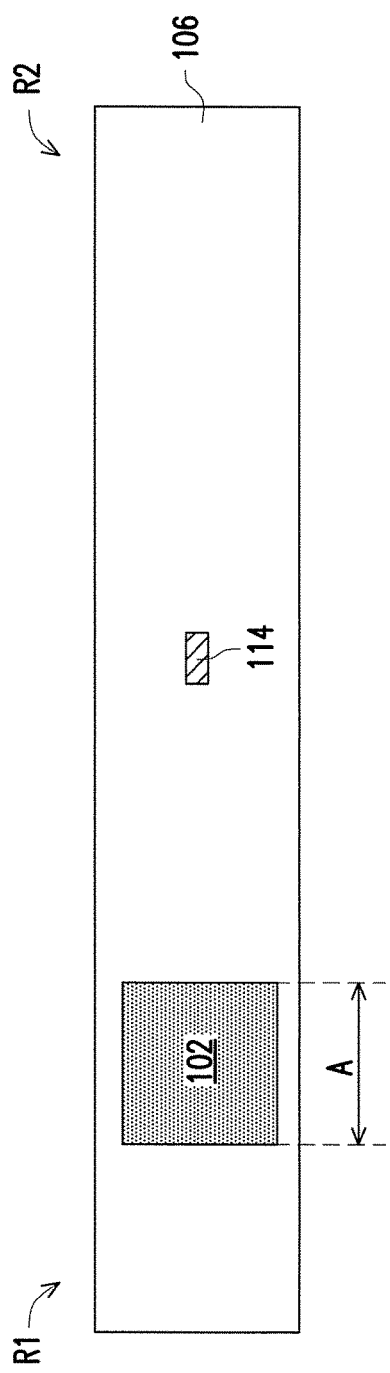
FIG. 3A is a plan view of a first polymer layer of a package structure according to a second embodiment of the disclosure.
Figure 3B:
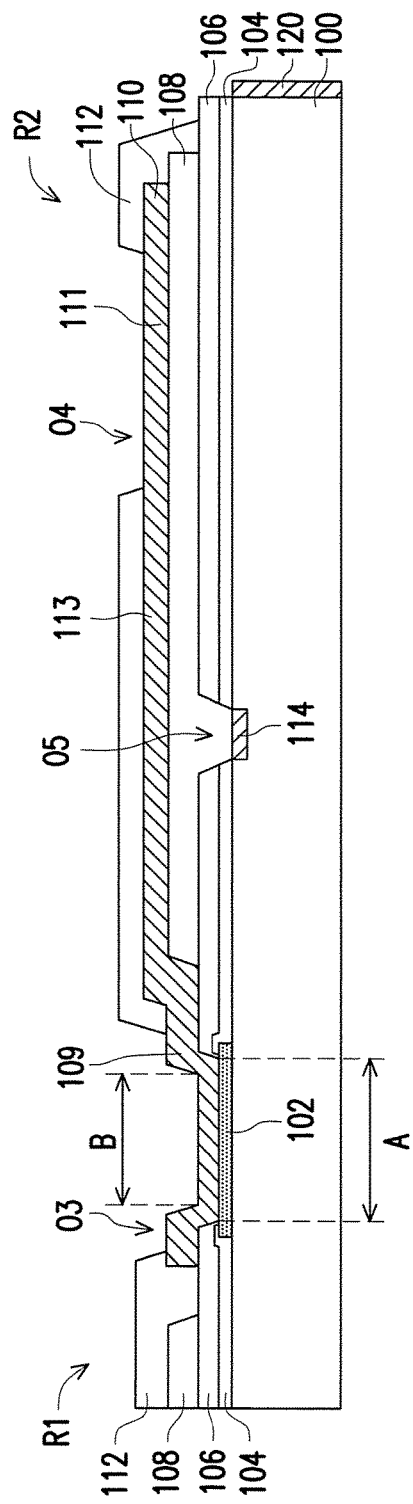
FIG. 3B is a schematic cross-sectional view of FIG. 3A.

FIG. 3A is a plan view of a first polymer layer of a package structure according to a second embodiment of the disclosure. FIG. 3B is a schematic cross-sectional view of FIG. 3A.

Referring to FIGS. 3A and 3B, basically, the package structure of the second embodiment is similar to the package structure of the first embodiment, and a difference between them lies in that the package structure of the second embodiment includes the fuse structure 114. The fuse structure 114 is located in the substrate 100 between the first region R1 and the second region R2. Specifically, as shown in FIG. 3B, a fifth opening O5 is provided in the passivation layer 104 and the first polymer layer 106. The fifth opening O5 corresponds to the fuse structure 114 and exposes a surface of the fuse structure 114. The second polymer layer 108 that is subsequently formed fills the fifth opening O5 to contact the fuse structure 114. In an embodiment, the second polymer layer 108 electrically insulates the fuse structure 114 (or any other conductive layer) from the trace 113 (i.e., portion of the RDL 110), so as to avoid an electric short circuit. In an embodiment, the fuse structure 114 is configured to perform a fuse repair. For example, when a memory device (hereinafter "memory chip") is provided in the substrate 100, the memory chip generally includes pre-designed excess memory cells. When a CP test is performed on the memory chip, functional memory cells and defective memory cells can be found by measurement. Therefore, the fuse structure in the memory chip may be melted by a laser so as to separate the functional memory cells and the defective memory cells from each other, and the defective memory cells may be replaced with the excess memory cells. In this way, a preset number of functional memory cells can be maintained in the memory chip.

FIG. 4 is a schematic cross-sectional view of a package structure according to a third embodiment of the disclosure.

Referring to FIG. 4, basically, the package structure of the third embodiment is similar to the package structure of the second embodiment, and a difference between them lies in that the test pad 109' of the package structure of the third embodiment only has the extension portion 109b on one side. That is, the extension portion 109b extends from one side of the flat portion 109a onto a sidewall and the partial top surface 106a of the first polymer layer 106, and a sidewall and the top surface of the second polymer layer 108. A protruding portion 109c may be regarded as a portion of the flat portion 109a, extending from the other side of the flat portion 109a onto between the third polymer layer 112 and the passivation layer 104. A gap is provided between the protruding portion 109c and the first polymer layer 106, so that the third polymer layer 112 fills the gap. In the present embodiment, the test pad 109' is located on an edge portion of the package structure (or the chip). Therefore, the test pad 109' does not have another extension portion. It is clear from FIG. 4 that the second polymer layer 108 is not present on the side closer to the protruding portion 109c (i.e., the edge portion of the package structure). In an embodiment, the extension portion 109b has a sidewall inclined relative to a top surface or a bottom surface of the flat portion 109a, and a top surface of the protruding portion 109c is substantially coplanar with the top surface of the flat portion 109a.

In summary, in the disclosure, by reducing the thickness of the polymer layer below the extension portion of the test pad, the width of the flat portion of the test pad is increased. The disclosure has a CP test region larger than conventional CP test regions, so that operation window in placing probe pins can be increased and a yield of the CP test can be improved.

Although the disclosure has been described with reference to the above embodiments, it will be apparent to one of ordinary skill in the art that modifications to the described embodiments may be made without departing from the spirit of the disclosure. Accordingly, the scope of the disclosure will be defined by the attached claims and not by the above detailed descriptions.

What is claimed is:

1. A package structure, comprising:
   a substrate;
   a metal pad located on the substrate;
   a first polymer layer located on the substrate, the first polymer layer having a first opening, the first opening exposing a portion of a top surface of the metal pad;
   a second polymer layer located on the first polymer layer, the second polymer layer having a second opening, the second opening exposing the portion of the top surface of the metal pad and a first top surface of the first polymer layer;
   a redistribution layer (RDL), covering the portion of the top surface of the metal pad and extending onto a portion of the first top surface of the first polymer layer and the second polymer layer; and
   a third polymer layer, located on the RDL, the third polymer layer having a third opening, the third opening exposing a portion of a top surface of the RDL, wherein the third opening corresponds to the metal pad, and the third opening is greater than the first opening and smaller than the second opening.

2. The package structure according to claim 1, further comprising a passivation layer located between the substrate and the first polymer layer.

3. The package structure according to claim 2, wherein the passivation layer comprises silicon nitride.

4. The package structure according to claim 2, wherein a fifth opening is in the passivation layer and the first polymer layer, the fifth opening corresponds to a fuse structure and exposes a portion of a surface of the fuse structure.

5. The package structure according to claim 1, wherein the third polymer layer comprises polyimide (PI), benzocyclobutene (BCB), polybenzooxazole (PBO) or a combination thereof.

6. The package structure according to claim 1, wherein the second opening is larger than the first opening.

7. The package structure according to claim 1, wherein the RDL directly contacts the portion of the first top surface of the first polymer layer.

8. The package structure according to claim 1, wherein the RDL comprises a test pad corresponding to the metal pad, and the test pad comprises:
   a flat portion located on a bottom surface of the first opening; and
   an extension portion extending from one side of the flat portion onto a sidewall of the first opening and the portion of the first top surface of the first polymer layer.

9. The package structure according to claim 8, wherein an angle between a bottom surface and a sidewall of the extension portion is 10 degrees to 90 degrees.

10. The package structure according to claim 8, wherein a width of the flat portion is 15 μm to 70 μm.

11. The package structure according to claim 8, wherein a ratio between a width of the flat portion and a width of the metal pad is 15:30 to 90:100.

12. The package structure according to claim 8, wherein a number of the extension portion is two, and the two extension portions respectively extend from both sides of the flat portion onto the both sidewalls of the first opening and the portion of the first top surface of the first polymer layer.

13. The package structure according to claim 8, wherein the substrate has a first region and a second region,
   the metal pad is located on the substrate in the first region,
   the first polymer layer, the second polymer layer and the RDL are sequentially located on the substrate in the first region and the second region, and the RDL extends from the portion of the top surface of the metal pad onto the portion of the first top surface of the first polymer layer and the second polymer layer in the second region.

14. The package structure according to claim 13, wherein the third polymer layer has the third opening and a fourth opening, the third opening exposes the portion of the top surface of the RDL in the first region, and the fourth opening exposes a portion of the top surface of the RDL in the second region.

15. The package structure according to claim 14, wherein the metal pad corresponding to the third opening is used to perform a chip probing (CP) test.

16. The package structure according to claim 13, further comprising a fuse structure located in the substrate between the first region and the second region.

17. The package structure according to claim 1, wherein the first polymer layer comprises polyimide (PI), benzocyclobutene (BCB), polybenzooxazole (PBO) or a combination thereof.

18. The package structure according to claim 1, wherein the second polymer layer comprises polyimide (PI), benzocyclobutene (BCB), polybenzooxazole (PBO) or a combination thereof.

19. The package structure according to claim 1, further comprising a seal ring disposed on a sidewall of the substrate.

* * * * *